US012713807B2

(12) United States Patent
Kim et al.

(10) Patent No.: US 12,713,807 B2
(45) Date of Patent: Aug. 18, 2026

(54) DISPLAY DEVICE HAVING PHOTO-SENSING ELEMENT

(71) Applicant: Samsung Display Co., Ltd., Yongin-si (KR)

(72) Inventors: Hyeonsik Kim, Yongin-si (KR); Yong-Han Park, Hwaseong-si (KR); Sangwoo Kim, Seoul (KR); Dae-Young Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 582 days.

(21) Appl. No.: 18/179,260

(22) Filed: Mar. 6, 2023

(65) Prior Publication Data

US 2023/0292575 A1 Sep. 14, 2023

(30) Foreign Application Priority Data

Mar. 14, 2022 (KR) ........................ 10-2022-0031486

(51) Int. Cl.

*H10K 59/65* (2023.01)
*G06V 40/13* (2022.01)
*H10K 59/12* (2023.01)
*H10K 59/122* (2023.01)

(Continued)

(52) U.S. Cl.

CPC ......... *H10K 59/65* (2023.02); *G06V 40/1318* (2022.01); *H10K 59/1201* (2023.02); *H10K 59/122* (2023.02); *H10K 59/353* (2023.02); *H10K 71/00* (2023.02)

(58) Field of Classification Search

CPC .. H10K 59/65; H10K 59/1201; H10K 59/122; H10K 59/353; H10K 71/00; H10K 39/34; H10K 59/60; H10K 50/852; H10K 59/131; H10K 59/35; G06V 40/1318; H01L 27/322; H01L 51/5237; H01L 51/56;

(Continued)

(56) References Cited

U.S. PATENT DOCUMENTS 10,140,536 B2 * 11/2018 Hung .................. A61B 5/1172
10,410,037 B2 * 9/2019 He ........................ G06F 3/0412
10,763,315 B2 * 9/2020 Bang .................... H10F 30/223

(Continued)

FOREIGN PATENT DOCUMENTS

KR 10-2020-0037653 A 4/2020
KR 10-2020-0080484 A 7/2020

(Continued)

*Primary Examiner* — Caleb E Henry

(74) *Attorney, Agent, or Firm* — Womble Bond Dickinson (US) LLP

(57) ABSTRACT

A display device includes: a base layer; a circuit layer on the base layer; and an element layer on the circuit layer and including a plurality of light emitting elements and a photo-sensing element, wherein the plurality of light emitting elements include: a first emission layer configured to emit a first color light; a second emission layer configured to emit a second color light different from the first color light; and a third emission layer configured to emit a third color light different from the first color light and the second color light, and the photo-sensing element includes a photoelectric conversion layer overlapping at least any one of a part of the first emission layer, a part of the second emission layer, or a part of the third emission layer.

10 Claims, 9 Drawing Sheets

(51) Int. Cl.
*H10K 59/35* (2023.01)
*H10K 71/00* (2023.01)

(58) Field of Classification Search
CPC ............. H01L 51/5275; H01L 27/3211; H01L 27/3272; H01L 2227/323
See application file for complete search history.

(56) References Cited

U.S. PATENT DOCUMENTS 11,002,888 B2* 5/2021 Ma ......................... H10K 77/10
11,003,266 B2* 5/2021 Kim ....................... H10D 86/60
11,017,200 B1* 5/2021 Wickboldt .......... H04L 63/0861
11,121,196 B2* 9/2021 Lee ........................ H10K 30/82
11,361,578 B2* 6/2022 Li ......................... G06F 3/0446
11,600,099 B2* 3/2023 Wang ................. G06V 40/1318
11,756,330 B2* 9/2023 Li ........................ G06V 10/145
11,842,558 B2* 12/2023 Kim ....................... H10K 59/65
2014/0145177 A1* 5/2014 Lee ...................... H10D 86/441 438/34
2014/0346498 A1* 11/2014 Ahn ................... H10D 30/6723 257/43
2015/0021627 A1* 1/2015 Fujita ...................... H10F 71/00 257/82
2015/0331508 A1* 11/2015 Nho ...................... G06F 3/0443 345/173
2016/0302665 A1* 10/2016 Swedish .............. A61B 3/0091
2017/0213872 A1* 7/2017 Jinbo ..................... H10K 59/40
2017/0220840 A1* 8/2017 Wickboldt ......... G06V 40/1335
2017/0346032 A1 11/2017 Ma et al.
2018/0012069 A1* 1/2018 Chung ............... G06V 40/1394
2018/0141969 A1* 5/2018 Hwang ................ G01N 33/582
2018/0239941 A1* 8/2018 Mackey ............. G06V 40/1318
2019/0214420 A1* 7/2019 Kim .................... H10F 39/8057
2020/0026898 A1* 1/2020 Fan .................... G06V 40/1318
2020/0117875 A1* 4/2020 Cai ........................ G06V 40/13
2020/0184185 A1* 6/2020 Mackey ............. G06V 40/1324
2020/0212138 A1* 7/2020 Lee ...................... H10K 59/873
2020/0219915 A1* 7/2020 Kim ................... G06V 40/1318
2020/0219948 A1* 7/2020 Kim ...................... G06F 3/0412
2020/0242320 A1* 7/2020 Zeng ..................... H10F 39/198
2020/0380239 A1* 12/2020 Lee ........................ H10K 59/12
2020/0387684 A1* 12/2020 Setlak ................ G06V 40/1318
2021/0036047 A1* 2/2021 Heo ........................ H10K 59/40
2022/0050992 A1* 2/2022 Wang ................. G06V 40/1318
2022/0073550 A1* 3/2022 Ahn ..................... H10K 85/346
2022/0173174 A1 6/2022 Hatsumi et al.
2022/0173338 A1* 6/2022 Ko ....................... H10K 85/654
2022/0209142 A1* 6/2022 Kim .................... C07F 15/0086
2022/0230427 A1* 7/2022 Kim ..................... G06V 10/141
2022/0310927 A1* 9/2022 Lee ...................... H10K 85/346
2022/0310942 A1* 9/2022 Shin ..................... H10K 85/346
2022/0336760 A1* 10/2022 Kim ..................... H10K 85/346
2022/0340571 A1* 10/2022 Kim ................... C09K 11/7705
2022/0388989 A1* 12/2022 Lee ...................... C07D 403/10

FOREIGN PATENT DOCUMENTS

KR 10-2021-0126649 A 10/2021
WO WO 2020-165686 A1 8/2020

* cited by examiner

FIG. 3

PX
VL1
ELVDD
Cst
ET1
PD
DLi
Di
T2
SWLj
SWj
N1
T1
EMLj
EMj
T3
SCLj
SCj
SILj
SIj
T4
ET2
Id
SBLj
SBj
T5
Ibp
Ied
ED
VL3
VL4
VINT1
VINT2
ELVSS
VL2
FX
Vrst
VL5
RCL
RST
ST1
SLVD
SD
SN1
ST2
SN2
ST3
SWLj
SWj
FSd
OPD1
OPD2
RLd
LSU

DISPLAY DEVICE HAVING PHOTO-SENSING ELEMENT

CROSS-REFERENCE TO RELATED APPLICATIONS

The present application claims priority to and the benefit of Korean Patent Application No. 10-2022-0031486, filed on Mar. 14, 2022, the entire content of which is hereby incorporated by reference.

BACKGROUND

1. Field

Aspects of some embodiments of the present disclosure herein relate to a high-resolution display device that may recognize biometric information, and a method of manufacturing the display device.

2. Description of the Related Art

Display devices serve various functions that allow graphical communication with users, such as providing information to the users by displaying images or detecting user inputs. Current display devices include a function for detecting biometric information of users as well. Biometric information recognition methods include a capacitance method detecting changes in capacitance formed between electrodes, an optical method detecting incident light using optical sensors, and an ultrasonic method detecting vibration using piezoelectric materials.

The above information disclosed in this Background section is only for enhancement of understanding of the background and therefore the information discussed in this Background section does not necessarily constitute prior art.

SUMMARY

Aspects of some embodiments of the present disclosure include a high-resolution display device that may recognize biometric information.

Aspects of some embodiments of the present disclosure may also include a method of manufacturing a high-resolution display device that may recognize biometric information.

According to some embodiments of the present disclosure, a display device may include a base layer, a circuit layer on the base layer, and an element layer on the circuit layer and including a plurality of light emitting elements and a photo-sensing element. According to some embodiments, the plurality of light emitting elements may include a first emission layer that emits first color light, a second emission layer that emits second color light different from the first color light, and a third emission layer that emits third color light different from the first color light and the second color light. According to some embodiments, the photo-sensing element may include a photoelectric conversion layer overlapping at least any one of a part of the first emission layer, a part of the second emission layer, or a part of the third emission layer.

According to some embodiments, the display device may further include a pixel defining film on the circuit layer and having a first opening in which the first emission layer is located, a second opening in which the second emission layer is located, and a third opening in which the third emission layer is defined therein. According to some embodiments, the photoelectric conversion layer may non-overlap the first opening, the second opening, and the third opening.

According to some embodiments, the first emission layer, the second emission layer, and the third emission layer may be spaced apart.

According to some embodiments, the photoelectric conversion layer may overlap portions of each of the first to third emission layers.

According to some embodiments, a portion of the photoelectric conversion layer may be above a portion of at least any one of the first emission layer, the second emission layer, or the third emission layer.

According to some embodiments, a portion of the photoelectric conversion layer may be below a portion of at least any one of the first emission layer, the second emission layer, or the third emission layer.

According to some embodiments, the photo-sensing element may further include an auxiliary photoelectric conversion layer below the photoelectric conversion layer, wherein the photoelectric conversion layer and the auxiliary photoelectric conversion layer may be in direct contact.

According to some embodiments, a part of the auxiliary photoelectric conversion layer may overlap at least any one of the first emission layer, the second emission layer, or the third emission layer.

According to some embodiments, an edge of the photoelectric conversion layer and an edge of the auxiliary photoelectric conversion layer may be aligned.

According to some embodiments, the plurality of light emitting elements may further include at least any one of a first auxiliary emission layer below the first emission layer, a second auxiliary emission layer below the second emission layer, or a third auxiliary emission layer below the third emission layer.

According to some embodiments, an edge of the first emission layer and an edge of the first auxiliary emission layer may be aligned, an edge of the second emission layer and an edge of the second auxiliary emission layer may be aligned, and an edge of the third emission layer and an edge of the third auxiliary emission layer may be aligned.

According to some embodiments of the inventive concept, a method of manufacturing a display device may include forming a circuit layer on a base layer and forming an element layer on the circuit layer. According to some embodiments, the forming of the element layer may include forming a first emission layer, forming a second emission layer, forming a third emission layer, and forming a photoelectric conversion layer. According to some embodiments, a part of the photoelectric conversion layer may overlap at least any one of the first emission layer, the second emission layer, or the third emission layer.

According to some embodiments, the forming of the element layer may include sequentially forming the first emission layer, the photoelectric conversion layer, the second emission layer, and the third emission layer.

According to some embodiments, the forming of the element layer may include sequentially forming the first emission layer, the second emission layer, the photoelectric conversion layer, and the third emission layer.

According to some embodiments, the forming of the element layer may include sequentially forming the first emission layer, the second emission layer, the third emission layer, and the photoelectric conversion layer.

According to some embodiments, the forming of the element layer may further include forming an auxiliary photoelectric conversion layer, wherein the auxiliary photoelectric conversion layer may be formed below the photoelectric conversion layer.

According to some embodiments, in the forming of the auxiliary photoelectric conversion layer, the auxiliary photoelectric conversion layer may be formed to overlap at least any one of a part of the first emission layer, a part of the second emission layer, or a part of the third emission layer.

According to some embodiments, the method may further include forming a pixel defining film in which a first opening, a second opening, and a third opening are defined on the circuit layer, wherein the first emission layer may be formed in the first opening, the second emission layer may be formed in the second opening, and the third emission layer may be formed in the third opening.

According to some embodiments, in the forming of the photoelectric conversion layer, the photoelectric conversion layer may be formed to non-overlap the first opening, the second opening, and the third opening.

According to some embodiments, the forming of the element layer may further include forming a first auxiliary emission layer, a second auxiliary emission layer, and a third auxiliary emission layer, wherein the first emission layer may be formed on the first auxiliary emission layer, the second emission layer may be formed on the second auxiliary emission layer, and the third emission layer may be formed on the third auxiliary emission layer.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 3 is a block diagram of a display device according to some embodiments of the inventive concept;

DETAILED DESCRIPTION

Figure 1:
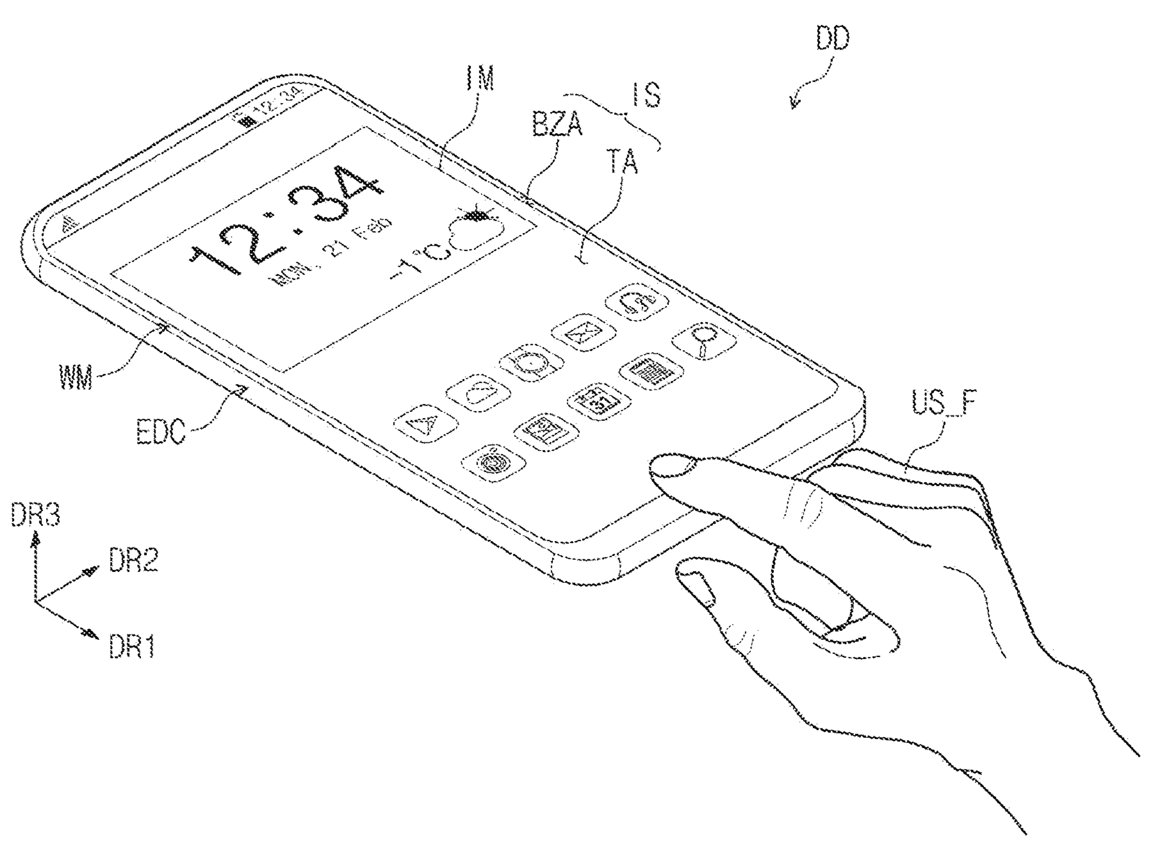
FIG. 1 is a perspective view of a display device according to some embodiments of the inventive concept.

In the present description, when an element (or a region, a layer, a portion, etc.) is referred to as being "on," "connected to," or "coupled to" another element, it means that the element may be directly located on/connected to/coupled to the other element, or that a third element may be located therebetween.

Like reference numerals refer to like elements. In addition, in the drawings, the thickness, the ratio, and the dimensions of elements are exaggerated for an effective description of technical contents. The term "and/or," includes all combinations of one or more of which associated configurations may define.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

Also, terms of "below", "on lower side", "above", "on upper side", or the like may be used to describe the relationships of the components illustrated in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

The terms "part" and "unit" refer to a software component or a hardware component that performs a specific function. A hardware component may include, for example, a field-programmable gate array (FPGA) or an application-specific integrated circuit (ASIC). A software component may refer to executable code and/or data used by the executable code in an addressable storage medium. Thus, software components may be, for example, object-oriented software components, class components, and task components, and may include processes, functions, attributes, procedures, subroutines, segments of program code, drivers, firmware, micro codes, circuits, data, a database, data structures, tables, arrays, or variables.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

Hereinafter, embodiments of the inventive concept will be described with reference to the accompanying drawings.

Figure 2:
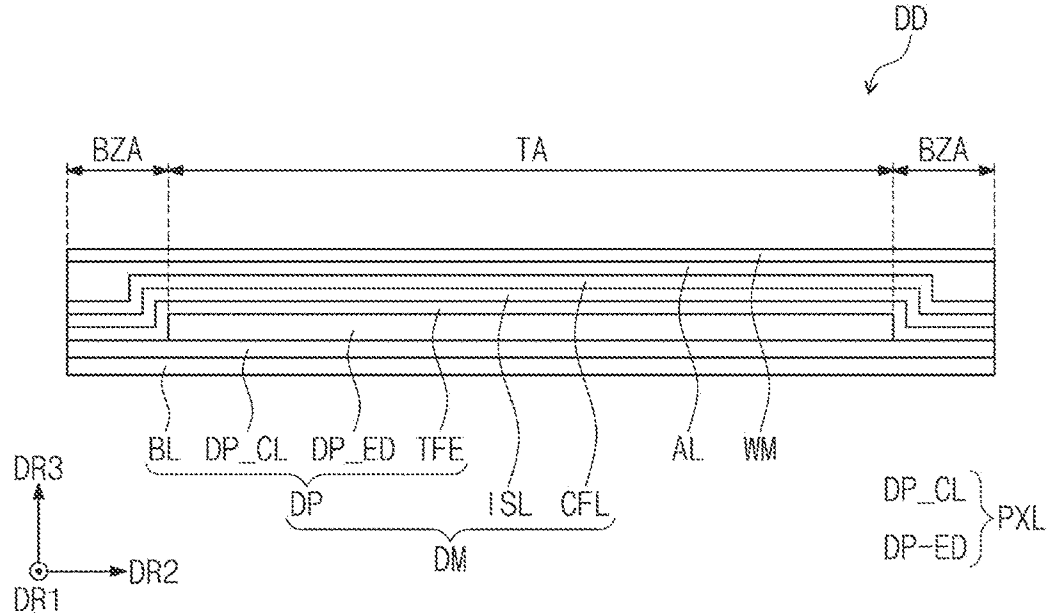
FIG. 2 is a cross-sectional view of a display device according to some embodiments of the inventive concept.

FIG. 1 is a perspective view of a display device DD according to some embodiments of the inventive concept. FIG. 2 is a cross-sectional view of a display device DD according to some embodiments of the inventive concept.

Referring to FIGS. 1 and 2, the display device DD may be a device which is activated according to electrical signals. For example, the display device DD may be a mobile phone, a tablet, a car navigation system, a game console, or a wearable device, but is not limited thereto. In FIG. 1, a mobile phone is shown as an example of the display device DD.

An upper surface of the display device DD may be defined as a display surface IS, and may have a plane defined by the first direction DR1 and the second direction DR2. Images IM generated in the display device DD may be provided to users through the display surface IS. Hereinafter, a normal direction perpendicular (or substantially perpendicular) to a plane defined by the first direction DR1 and the second direction DR2 is defined as a third direction DR3. In the present description, "when viewed on a plane" may be defined as viewed from the third direction DR3. That is, the plane may be parallel to a plane defined by the first direction DR1 and the second direction DR2.

The display surface IS may be divided into a transmission region TA and a bezel region BZA. The transmission region TA may be an area or region in which the images IM are displayed. Users view the images IM through the transmission region TA. According to some embodiments, the transmission region TA is shown to be in a rectangular shape having rounded corners. However, this is presented as an example, and the transmission region TA may have various shapes and is not limited to any particular embodiments.

The bezel region BZA is adjacent to the transmission region TA. The bezel region BZA may have a color (e.g., a set or predetermined color). The bezel region BZA may surround the transmission region TA. Accordingly, the shape of the transmission region TA may be substantially defined by the bezel region BZA. However, this is merely shown as an example, and the bezel region BZA may be located adjacent to only one side of the transmission region TA or omitted.

The display device DD may detect external inputs applied from the outside. The external inputs may include various forms of inputs provided from outside the display device DD. For example, the external inputs may include external inputs applied when approaching the display device DD or being adjacent by a distance (e.g., a set or predetermined distance) (e.g., hovering), as well as contact by a part of a body such as a user's hand US_F. In addition, the external inputs may have various forms such as force, pressure, temperature, light, etc. The external inputs may be provided through a separate device, for example, an active pen or a digitizer pen.

The display device DD may detect users' biometric information applied from the outside. A biometric information sensing region capable of detecting users' biometric information may be provided on the display surface IS of the display device DD. The biometric information sensing region may be provided throughout the transmission region TA or may be provided in a portion of the transmission region TA. FIG. 1 shows that the entire portion of the transmission region TA is used as a biometric information sensing region, but the embodiments of the inventive concept are not limited thereto and the biometric information sensing region may be provided in a portion of the transmission region TA.

An outer portion of the display device DD may include a window WM and a housing EDC. For example, the window WM and the housing EDC may combine together, and other components of the display device DD, for example, a display module DM, may be accommodated therein.

A front surface of the window WM may define the display surface IS of the display device DD. The window WM may include an optically transparent insulating material. For example, the window WP may include glass or plastic. The window WM may have a multi-layer structure or a single-layer structure. For example, the window WM may include a plurality of plastic films bonded through an adhesive, or a glass substrate and a plastic film, which are bonded through an adhesive.

The housing EDC may include a material having a relatively higher rigidity. For example, the housing EDC may include a plurality of frames and/or plates formed of glass, plastic, or metal, or a combination thereof. The housing EDC may relatively stably protect components of the display device DD, which are accommodated in an inner space, against external impacts. According to some embodiments, a battery module supplying power required for the overall operation of the display device DD may be further located between the display module DM and the housing EDC.

The display module DM may include a display panel DP, an input sensing layer ISL, and an anti-reflection layer CFL.

The display panel DP may be configured to substantially generate images. The display panel DP may be a light emitting display panel, and for example, the display panel DP may be an organic light emitting display panel, an inorganic light emitting display panel, an organic-inorganic light emitting display panel, a quantum dot display panel, a micro LED display panel, or a nano LED display panel. Hereinafter, the display panel DP will be described as an organic light emitting display panel.

The display panel DP includes a base layer BL, a pixel layer PXL, and an encapsulation layer TFE. The display panel DP according to some embodiments of the inventive concept may be a flexible display panel. However, the embodiments of the inventive concept are not limited thereto. For example, the display panel DP may be a foldable display panel or a rigid display panel that is folded with respect to a folding axis.

The base layer BL may include a synthetic resin layer. The synthetic resin layer may be a polyimide resin layer, and the material is not particularly limited. In addition, the base layer BL may include a glass substrate, a metal substrate, or an organic/inorganic composite material substrate.

The pixel layer PXL is located on the base layer BL. The pixel layer PXL may include a circuit layer DP_CL and an element layer DP_ED. The circuit layer DP_CL is located between the base layer BL and the element layer DP_ED.

The circuit layer DP_CL includes at least one insulating layer and a circuit element. Hereinafter, an insulating layer included in the circuit layer DP_CL is referred to as an intermediate insulating layer. The intermediate insulating layer may include at least one intermediate inorganic film and/or at least one intermediate organic film. The circuit element may include a pixel driving circuit included in each of a plurality of pixels for displaying images, a sensor driving circuit included in each of a plurality of sensors for recognizing external information, and the like. External information may be biometric information. As an example of the inventive concept, the sensor may be a fingerprint recognition sensor, a proximity sensor, an iris recognition sensor, or the like. In addition, the sensor may be an optical sensor that recognizes biometric information in an optical manner. The circuit layer DP_CL may further include signal lines connected to the pixel driving circuit and/or the sensor driving circuit.

The element layer DP_ED may include a plurality of light emitting elements included in each of pixels and a photo-sensing element included in each of sensors. The plurality of light emitting elements may include a first emission layer EL1 (see FIG. 5), a second emission layer EL2 (see FIG. 5), and a third emission layer EL3 (see FIG. 5). As an example of the inventive concept, the photo-sensing element may be a photo-diode. The photo-sensing element may be a sensor that detects or responds to light reflected by a user's finger-print. The circuit layer DP_CL and the element layer DP_ED will be described in more detail later with reference to FIG. 6.

The encapsulation layer TFE seals the element layer DP-ED. The encapsulation layer TFE may include at least one organic layer and at least one inorganic layer. The inorganic film may include an inorganic material, and may protect the element layer DP-ED from moisture/oxygen. The inorganic film may include a silicon nitride layer, a silicon oxy nitride layer, a silicon oxide layer, a titanium oxide layer, an aluminum oxide layer, and the like, but is not particularly limited thereto. The organic layer includes an organic material, and may protect the element layer DP-ED from foreign materials such as dust particles.

The input sensing layer ISL may be formed on the display panel DP. The input sensing layer ISL may be located directly on the encapsulation layer TFE. According to some embodiments of the inventive concept, the input sensing layer ISP may be formed on the display panel DP through a roll-to-roll process. That is, when the input sensing layer ISL is located directly on the display panel DP, an adhesive film is not located between the input sensing layer ISL and the encapsulation layer TFE. Alternatively, an adhesive film may be located between the input sensing layer ISL and the display panel DP. In this case, the input sensing layer ISP is not manufactured along with the display panel DP through a roll-to-roll process, and after being manufactured through a separate process from the display panel DP, the input sensing unit ISP may be fixed on an upper surface of the display panel DP through an adhesive film.

The input sensing layer ISL may detect external inputs (e.g., a user's touch) to convert the inputs into input signals (e.g., set or predetermined input signals), and provide the input signals to the display panel DP. The input sensing layer ISL may include a plurality of sensing electrodes for detecting external inputs. The sensing electrodes may sense the external input in a capacitive manner. The display panel DP may receive the input signals from the input sensing layer ISL and generate images corresponding to the input signals.

The anti-reflection layer CFL may be located on the input sensing layer ISL. The anti-reflection layer CFL may reduce reflectance of external light incident from the outside of the display device DD. The anti-reflection layer CFL may be formed on the input sensing layer ISL through a roll-to-roll process, but the embodiments of the inventive concept are not limited thereto. For example, the anti-reflection layer CFL may be located between the display panel DP and the input sensing layer ISL. The anti-reflection layer CFL may include color filters. The color filters may have an arrangement (e.g., a set or predetermined arrangement). For example, the color filters may be arranged in consideration of light emitting colors of pixels included in the display panel DP. In addition, the anti-reflection layer CFL may further include a black matrix adjacent to the color filters.

The display device DD according to some embodiments of the inventive concept may further include an adhesive layer AL. The window WM may be attached to the anti-reflection layer CFL through the adhesive layer AL. The adhesive layer AL may include an optical clear adhesive, an optically clear adhesive resin, or a pressure sensitive adhesive (PSA).

Figure 3:
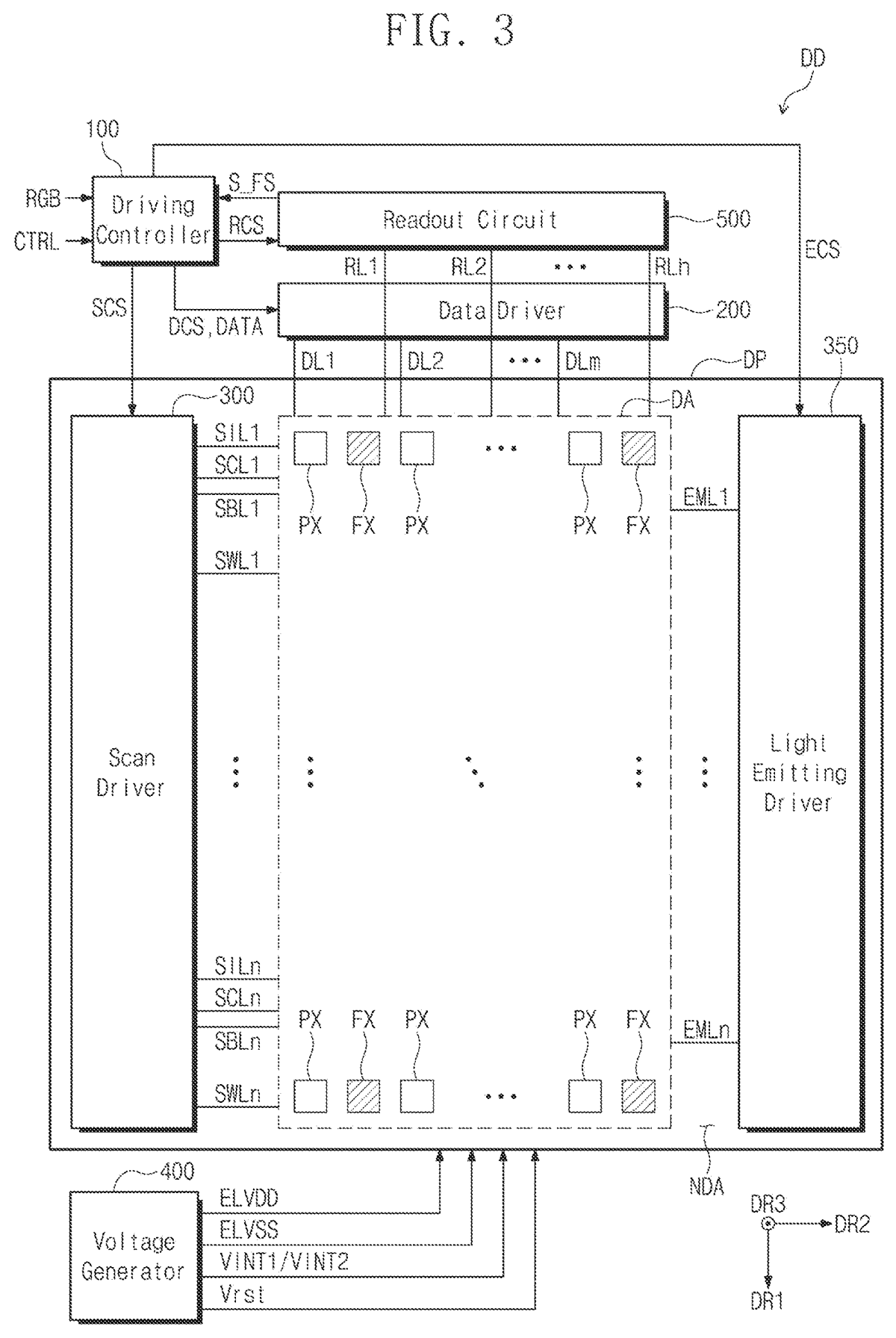

FIG. 3 is a block diagram of a display device DD according to some embodiments of the inventive concept.

Referring to FIG. 3, the display device DD includes a display panel DP, a panel driver, and a driving controller 100. As an example of the inventive concept, the panel driver includes a data driver 200, a scan driver 300, a light emitting driver 350, a voltage generator 400, and a readout circuit 500.

The driving controller 100 receives an image signal RGB and a control signal CTRL. The driving controller 100 generates an image data signal DATA in which the data format of the image signal RGB is converted to match the data driver 200 in interface specification. The driving controller 100 outputs a first control signal SCS, a second control signal ECS, a third control signal DCS, and a fourth control signal RCS.

The data driver 200 receives the third control signal DCS and the image data signal DATA from the driving controller 100. The data driver 200 converts the image data signal DATA into data signals and outputs the data signals to a plurality of data lines DL1 to DLm which will be described later. The data signals are analog voltages corresponding to the grayscale value of the image data signal DATA.

The scan driver 300 receives the first control signal SCS from the driving controller 100. The scan driver 300 may output scan signals to scan lines in response to the first control signal SCS.

The voltage generator 400 generates voltages required for the operation of the display panel DP. According to some embodiments, the voltage generator 400 generates a first driving voltage ELVDD, a second driving voltage ELVSS, a first initialization voltage VINT1, a second initialization voltage VINT2, and a reset voltage Vrst.

The display panel DP may include a display region DA corresponding to the transmission region TA (see FIG. 1) and a non-display region NDA corresponding to the bezel region BZA (see FIG. 1).

The display panel DP may include a plurality of pixels PX located in the display region DA and a plurality of sensors FX located in the display region DA. As an example of the inventive concept, each of the plurality of sensors FX may be located between two pixels PX which are placed adjacent. The plurality of pixels PX and the plurality of sensors FX may be alternately arranged in the first and second directions DR1 and DR2. However, the embodiments of the inventive concept are not limited thereto. That is, two or more pixels PX may be located between two sensors FX that are placed adjacent in the first direction DR1 among the plurality of sensors FX, or two or more pixels PX may be located between two sensors FX that are placed adjacent in the second direction DR2 among the plurality of sensors FX.

The display panel DP further includes initialization scan lines SIL1-SILn, compensation scan lines SCL1-SCLn, write scan lines SWL1-SWLn, black scan lines SBL1-SBLn, light emitting control lines EML1-EMLn, data lines DL1-DLm, and readout lines RL1-RLh.

The initialization scan lines SIL1-SILn, the compensation scan lines SCL1-SCLn, the write scan lines SWL1-SWLn, the black scan lines SBL1-SBLn, and the light emitting control lines EML1-EMLn extend in the second direction DR2. The initialization scan lines SIL1-SILn, the compensation scan lines SCL1-SCLn, the write scan lines SWL1-SWLn, the black scan lines SBL1-SBLn, and the light emitting control lines EML1-EMLn are arranged to be spaced apart in the first direction DR1. The data lines DL1-DLm and the readout lines RL1-RLh extend in the first direction DR1 and are arranged to be spaced apart in the second direction DR2.

The plurality of pixels PX are each electrically connected to the initialization scan lines SIL1-SILn, the compensation scan lines SCL1-SCLn, the write scan lines SWL1-SWLn, the black scan lines SBL1-SBLn, the light emitting control lines EML1-EMLn, and the data lines DL1-DLm. For example, each of the plurality of pixels PX may be electrically connected to four scan lines. However, the number of scan lines connected to respective pixels PX is not limited thereto and may change.

The plurality of sensors FX are each electrically connected to the write scan lines SWL1-SWLn and the readout lines RL1-RLh. One sensor FX may be electrically connected to one scan line. However, the embodiments of the inventive concept are not limited thereto. The number of scan lines connected to each sensor FX may vary. As an example of the inventive concept, the number of the readout lines RL1-RLh may correspond to half the number of the data lines DL1-DLm. However, the embodiments of the inventive concept are not limited thereto. Alternatively, the number of the readout lines RL1-RLh may correspond to one-fourth or one-eighth of the number of the data lines DL1-DLm.

The scan driver 300 may be located in the non-display region NDA of the display panel DP. However, the embodiments of the inventive concept are not particularly limited thereto. For example, at least a portion of the scan driver 300 may be located in the display region DA.

The scan driver 300 receives the first control signal SCS from the driving controller 100. In response to the first control signal SCS, the scan driver 300 outputs initialization scan signals to the initialization scan lines SIL1-SILn and outputs compensation scan signals to the compensation scan lines SCL1-SCLn. In addition, in response to the first control signal SCS, the scan driver 300 outputs write scan signals to the write scan lines SWL1-SWLn and outputs black scan signals to the black scan lines SBL1-SBLn. Alternatively, the scan driver 300 may include first and second scan drivers. The first scan driver may output initialization scan signals and compensation scan signals, and the second scan driver may output write scan signals and black scan signals.

The light emitting driver 350 may be located in the non-display region NDA of the display panel DP. The light emitting driver 350 receives the second control signal SCS from the driving controller 100. The light emitting driver 350 may output light emitting control signals to the light emitting control lines EML1-EMLn in response to the second control signal ECS. Alternatively, the scan driver 300 may be connected to the light emitting control lines EML1-EMLn. In this case, the light emitting driver 350 may be omitted, and the scan driver 300 may output light emitting control signals to the light emitting control lines EML1-EMLn.

The readout circuit 500 receives the fourth control signal RCS from the driving controller 100. The readout circuit 500 may receive sensing signals from the readout lines RL1-RLh in response to the fourth control signal RCS. The readout circuit 500 may process sensing signals delivered from the readout lines RL1-RLh and provide the processed sensing signals S_FS to the driving controller 100. The driving controller 100 may recognize biometric information based on the sensing signals S_FS.

Figure 4:
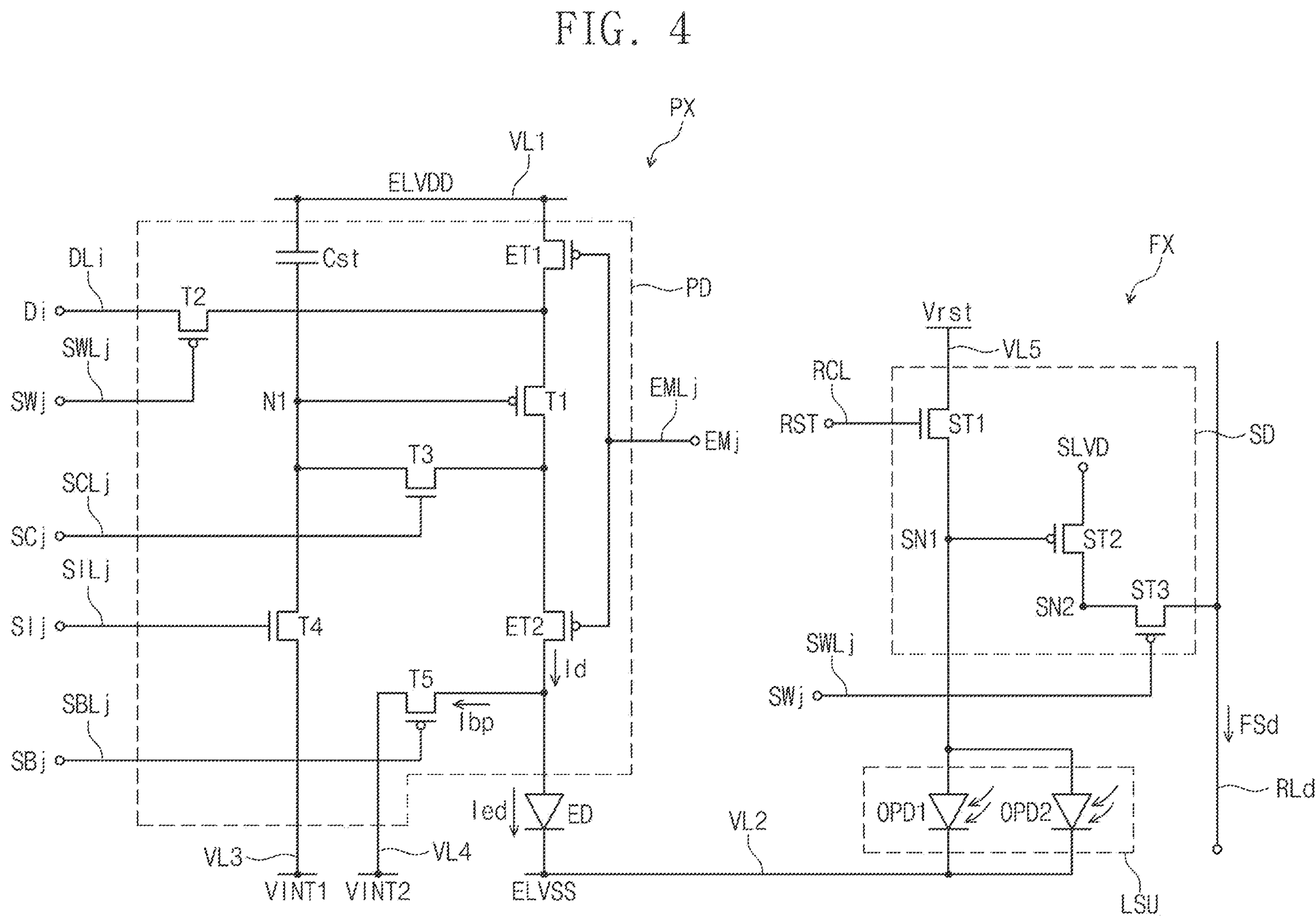
FIG. 4 is an equivalent circuit diagram of a pixel and a sensor according to some embodiments of the inventive concept.

FIG. 4 is an equivalent circuit diagram of a pixel PX and a sensor FX according to some embodiments of the inventive concept.

Since each of the plurality of pixels PX share the same circuit structure, detailed descriptions of the other pixels will be omitted as the descriptions of the circuit structure of the pixel PX shown in FIG. 4 are replaced. In addition, FIG. 4 shows an equivalent circuit diagram of one sensor FX among the plurality of sensors FX shown in FIG. 3 as an example. Since each of the plurality of sensors FX share the same circuit structure, detailed descriptions of the other pixels will be omitted as the above-descriptions of the circuit structure of the sensor FX are replaced.

Referring to FIGS. 3 and 4, the pixel PX is connected to an i-th data line DLi among the data lines DL1-DLm, a j-th initialization scan line SILj among the initialization scan lines SIL1-SILn, a j-th compensation scan line SCLj among the compensation scan lines SCL1-SCLn, a j-th write scan line SWLj among the write scan lines SWL1-SWLn, a j-th black scan line SBLj among the black scan lines SBL1-SBLn, and a j-th light emitting control line EMLj among the light emitting control lines EML1-EMLn.

The pixel PX includes a light emitting element ED and a pixel driving circuit PD. The light emitting element ED may be a light emitting diode. As an example of the inventive concept, the light emitting element ED may be an organic light emitting diode including an organic emission layer.

The pixel driving circuit PD includes first to fifth transistors T1, T2, T3, T4, and T5, first and second light emitting control transistors ET1 and ET2, and one capacitor Cst.

At least one of the first to fifth transistors T1, T2, T3, T4, or T5 and the first and second light emitting control transistors ET1 and ET2 may be a transistor having a low-temperature polycrystalline silicon (LTPS) semiconductor layer. At least one of the first to fifth transistors T1, T2, T3, T4, or T5 and the first and second light emitting control transistors ET1 and ET2 may be a transistor having an oxide semiconductor layer. For example, the third and fourth transistors T3 and T4 may be oxide semiconductor transistors, and the first, second, and fifth transistors T1, T2, and T5 and the first and second light emitting control transistors ET1 and ET2 may be LTPS transistors.

To be specific, the first transistor T1 that directly affects the brightness of the display device DD (see FIG. 1) is configured to include a semiconductor layer formed of polycrystalline silicon having high reliability, and accordingly, a high-resolution display device may be obtained. Meanwhile, the oxide semiconductor has high carrier mobility and low leakage current, and accordingly, does not have a big voltage drop even with long driving time. That is, the color change of images due to the voltage drop is not drastic even upon low-frequency driving, and thus the low-frequency driving is allowed. As described above, the oxide semiconductor may have relatively low leakage current, and thus at least one of the third transistor T3 or the fourth transistor T4 connected to the driving gate electrode of the first transistor T1 may be employed as an oxide semiconductor to prevent leakage current that may flow to the driving gate electrode and to reduce power consumption.

Some of the first to fifth transistors T1, T2, T3, T4, and T5 and the first and second light emitting control transistors ET1 and ET2 may be P-type transistors, and the others may be N-type transistors. For example, the first transistor T1, the second transistor T2, and the fifth transistor T5, and the first and second light emitting control transistors ET1 and ET2 may be P-type transistors, and the third and fourth transistors T3 and T4 may be N-type transistors.

The configuration of the pixel driving circuit PD according to some embodiments of the inventive concept is not limited to the embodiments shown with respect to FIG. 4. The pixel driving circuit PD shown in FIG. 4 is merely an example, and the configuration of the pixel driving circuit PD may be modified and carried out. For example, the first to fifth transistors T1, T2, T3, T4, and T5 and the first and second light emitting control transistors ET1 and ET2 may all be P-type transistors or N-type transistors.

The j-th initialization scan line SILj, the j-th compensation scan line SCLj, the j-th write scan line SWLj, the j-th black scan line SBLj, and the j-th light emitting control line EMLj may deliver the j-th initialization scan signal SIj, the j-th compensation scan signal SCj, the j-th write scan signal SWj, the j-th black scan signal SBj, and the j-th light emitting control signal EMj to the pixel PX, respectively. The i-th data line DLi transmits the i-th data signal Di to the pixel PX. The i-th data signal Di may have a voltage level corresponding to the image signal RGB input to the display device DD (see FIG. 3).

The first and second driving voltage lines VL1 and VL2 may deliver the first driving voltage ELVDD and the second driving voltage ELVSS to the pixel PX, respectively. In addition, the first and second initialization voltage lines VL3 and VL4 may deliver the first initialization voltage VINT1 and the second initialization voltage VINT2 to the pixel PX, respectively.

The first transistor T1 is connected between the first driving voltage line VL1 receiving the first driving voltage ELVDD and the light emitting element ED. The first transistor T1 may include a first electrode connected to the first driving voltage line VL1 via the first light emitting control transistor ET1, a second electrode connected to an anode of the light emitting element ED via the second light emitting control transistor ET2, and a third electrode (e.g., a gate electrode) connected to one end (e.g., a first node N1) of the capacitor Cst. The first transistor T1 may receive the i-th data signal Di delivered from the i-th data line DLi according to the switching operation of the second transistor T2 and supply a driving current Id to the light emitting element ED.

The second transistor T2 is connected between the data line DLi and the first electrode of the first transistor T1. The second transistor T2 includes a first electrode connected to the data line DLi, a second electrode connected to the first electrode of the first transistor T1, and a third electrode (e.g., a gate electrode) connected to the j-th write scan line SWLj. The second transistor T2 may be turned on according to the write scan signal SWj delivered through the j-th write scan line SWLj to deliver the i-th data signal Di delivered through the i-th data line DLi to the first electrode of the first transistor T1.

The third transistor T3 is connected between the second electrode of the first transistor T1 and the first node N1. The third transistor T3 includes a first electrode connected to the third electrode of the first transistor T1, a second electrode connected to the second electrode of the first transistor T1, and a third electrode (e.g., a gate electrode) connected to the j-th compensation scan line SCLj. The third transistor T3 may be turned on according to the j-th compensation scan signal SCj delivered through the j-th compensation scan line SCLj to connect the third electrode and the second electrode of the first transistor T1, thereby connecting the first transistor T1 with a diode.

The fourth transistor T4 is connected between the first initialization voltage line VL3 to which the first initialization voltage VINT1 is applied and the first node N1. The fourth transistor T4 includes a first electrode connected to the first initialization voltage line VL3 to which the first initialization voltage VINT1 is applied, a second electrode connected to the first node N1, and a third electrode (e.g., a gate electrode) connected to the j-th initialization scan line SILj. The fourth transistor T4 is turned on according to the j-th initialization scan signal SIj delivered through the j-th initialization scan line SILj. The turned-on fourth transistor T4 delivers the first initialization voltage VINT1 to the first node N1 to initialize the potential of the third electrode (i.e., the potential of the first node N1) of the first transistor T1.

The first light emitting control transistor ET1 includes a first electrode connected to the first driving voltage line VL1, a second electrode connected to the first electrode of the first transistor T1, and a third electrode (e.g., a gate electrode) connected to the j-th light emitting control line EMLj.

The second light emitting control transistor ET2 includes a first electrode connected to the second electrode of the first transistor T1, a second electrode connected to an anode of the light emitting element ED, and a third electrode (e.g., a gate electrode) connected to the j-th light emitting control line EMLj.

The first and second light emitting control transistors ET1 and ET2 are turned on together according to the j-th light emitting control signal EMj delivered through the j-th light emitting control line EMLj. The first driving voltage ELVDD applied through the turned-on first light emitting control transistor ET1 may be compensated through the diode-connected first transistor T1 and then delivered to the light emitting element ED.

The fifth transistor T5 includes a first electrode connected to the second initialization voltage line VL4 to which the second initialization voltage VINT2 is delivered, a second electrode connected to the second electrode of the second light emitting control transistor ET2, and a third electrode (e.g., a gate electrode) connected to the j-th black scan line SBLj. The second initialization voltage VINT2 may have a voltage level equal to or lower than that of the first initialization voltage VINT1. As an example of the inventive concept, each of the first and second initialization voltages VINT1 and VINT2 may have a voltage of about −3.5 V.

As described above, one end of the capacitor Cst is connected to the third electrode of the first transistor T1, and the other end thereof is connected to the first driving voltage line VL1. A cathode of the light emitting element ED may be connected to the second driving voltage line VL2 that delivers the second driving voltage ELVSS. The second driving voltage ELVSS may have a lower voltage level than the first driving voltage ELVDD. As an example of the inventive concept, the first driving voltage ELVDD may be about 4.6 V, and the second driving voltage ELVSS may be about −2.5 V.

The sensor FX is connected to a d-th readout line RLd among the readout lines RL1-RLh, a j-th write scan line SWLj, and a reset control line RCL.

The sensor FX includes a photo-sensing unit LSU and a sensor driving circuit SD. The photo-sensing unit LSU may include k photo-sensing elements connected in parallel. When k is 2, first and second photo-sensing elements OPD1 and OPD2 may be connected in parallel. Each of the first and second photo-sensing elements OPD1 and OPD2 may be a photo-diode. As an example of the inventive concept, each of the first and second photo-sensing elements OPD1 and OPD2 may be an organic photo-diode including an organic material as a photoelectric conversion layer. First and second anodes of the first and second photo-sensing elements OPD1 and OPD2 may be connected to a first sensing node SN1, and first and second cathodes thereof may be connected to the second driving voltage line VL2 of the second driving voltage ELVSS. When k is 4, first to fourth photo-sensing elements may be connected in parallel.

The sensor driving circuit SD includes three transistors ST1, ST2, and ST3. The three transistors ST1, ST2, and ST3 may be a reset transistor ST1, an amplification transistor ST2, and an output transistor ST3, respectively. At least one of the reset transistor ST1, the amplification transistor ST2, or the output transistor ST3 may be an oxide semiconductor transistor. As an example of the inventive concept, the reset transistor ST1 may be an oxide semiconductor transistor, and the amplification transistor ST2 and the output transistor ST3 may be LTPS transistors. However, the embodiments according to the present disclosure are not limited thereto, and at least the reset transistor ST1 and the output transistor ST3 may be oxide semiconductor transistors, and the amplification transistor ST2 may be an LTPS transistor.

In addition, some of the reset transistor ST1, the amplification transistor ST2, and the output transistor ST3 may be P-type transistors, and some may be N-type transistors. As an example of the inventive concept, the amplification transistor ST2 and the output transistor ST3 may be P-type transistors, and the reset transistor ST1 may be an N-type transistor. However, the embodiments of the inventive concept are not limited thereto, and the reset transistor ST1, the amplification transistor ST2, and the output transistor ST3 may all be N-type transistors or may all be P-type transistors.

The circuit configuration of the sensor driving circuit SD according to some embodiments of the inventive concept is not limited to what is shown in FIG. 4. The sensor driving circuit SD shown in FIG. 4 is merely an example, and the configuration of the sensor driving circuit SD may be modified and carried out.

The reset transistor ST1 includes a first electrode connected to the third initialization voltage line VL5 and receiving a reset voltage Vrst, a second electrode connected to the first sensing node SN1, and a third electrode receiving a reset control signal RST. The reset transistor ST1 may reset the potential of the first sensing node SN1 to the reset voltage Vrst in response to the reset control signal RST. The reset control signal RST may be a signal provided through the reset control line RCL. However, the embodiments of the inventive concept are not limited thereto. Alternatively, the reset control signal RST may be the j-th compensation scan signal SCj supplied through the j-th compensation scan line SCLj. That is, the reset transistor ST1 may receive the j-th compensation scan signal SCj supplied from the j-th compensation scan line SCLj as the reset control signal RST. As an example of the inventive concept, the reset voltage Vrst may have a lower voltage level than the second driving voltage ELVSS at least over an active duration of the reset control signal RST. The reset voltage Vrst may be a DC voltage kept at a lower voltage level than the second driving voltage ELVSS. For example, the reset voltage Vrst may be about −4.5 V.

The amplification transistor ST2 includes a first electrode receiving a sensing driving voltage, a second electrode connected to the second sensing node SN2, and a third electrode connected to the first sensing node SN1. The amplification transistor ST2 may be turned on according to the potential of the first sensing node SN1 to apply a sensing driving voltage to the second sensing node SN2. As an example of the inventive concept, the sensing driving voltage may be one of the first driving voltage ELVDD, the first initialization voltage VINT1, and the second initialization voltage VINT2. When the sensing driving voltage is the first driving voltage ELVDD, the first electrode of the amplification transistor ST2 may be electrically connected to the first driving voltage line VL1. When the sensing driving voltage is the first initialization voltage VINT1, the first electrode of the amplification transistor ST2 may be electrically connected to the first initialization voltage line VL3, and when the sensing driving voltage is the second initialization voltage VINT2, the first electrode of the amplification transistor ST2 may be electrically connected to the second initialization voltage line VL4.

The output transistor ST3 includes a first electrode connected to the second sensing node SN2, a second electrode connected to the d-th readout line RLd, and a third electrode receiving an output control signal. The output transistor ST3 may deliver a sensing signal FSd to the d-th readout line RLd in response to the output control signal. The output control signal may be the j-th write scan signal SWj supplied through the j-th write scan line SWLj. That is, the output transistor ST3 may receive the j-th write scan signal SWj supplied from the write scan line SWLj as an output control signal.

The photo-sensing unit LSU of the sensor FX may be exposed to light over light emitting duration of a plurality of light emitting elements. The light may be light output from any one of the plurality of light emitting elements.

When a user's hand US_F (see FIG. 1) touches a display surface, the first and second photo-sensing elements OPD1 and OPD2 may generate photocharges corresponding to light reflected by ridges of fingerprint or valleys between the ridges of fingerprint, and the generated photocharges may be accumulated in the first sensing node SN1.

The amplification transistor ST2 may be a source follower amplifier that generates a source-drain current in proportion to electric charge of the first sensing node SN1 input to the third electrode.

A low level j-th write scan signal SWj is supplied to the output transistor ST3 through the j-th write scan line SWLj. When the output transistor ST3 is turned on in response to the low level j-th write scan signal SWj, the sensing signal FSd corresponding to the current flowing through the amplification transistor ST2 may be output to the d-th readout line RLd.

When a high level reset control signal RST is supplied through the reset control line RCL, the reset transistor ST1 is turned on. The reset duration may be defined as an active duration (i.e., a high level duration) of the reset control line RCL. Alternatively, when the reset transistor ST1 is formed of a PMOS transistor, a low level reset control signal RST may be supplied to the reset control line RCL over the reset duration. Over the reset duration, the first sensing node SN1 may be reset to a potential corresponding to the reset voltage Vrst. As an example of the inventive concept, the reset voltage Vrst may have a lower voltage level than the second driving voltage ELVSS.

Then, when the reset duration ends, the photo-sensing unit LSU may generate photocharges corresponding to received light, and the generated photocharges may be accumulated in the first sensing node SN1.

Figure 5:
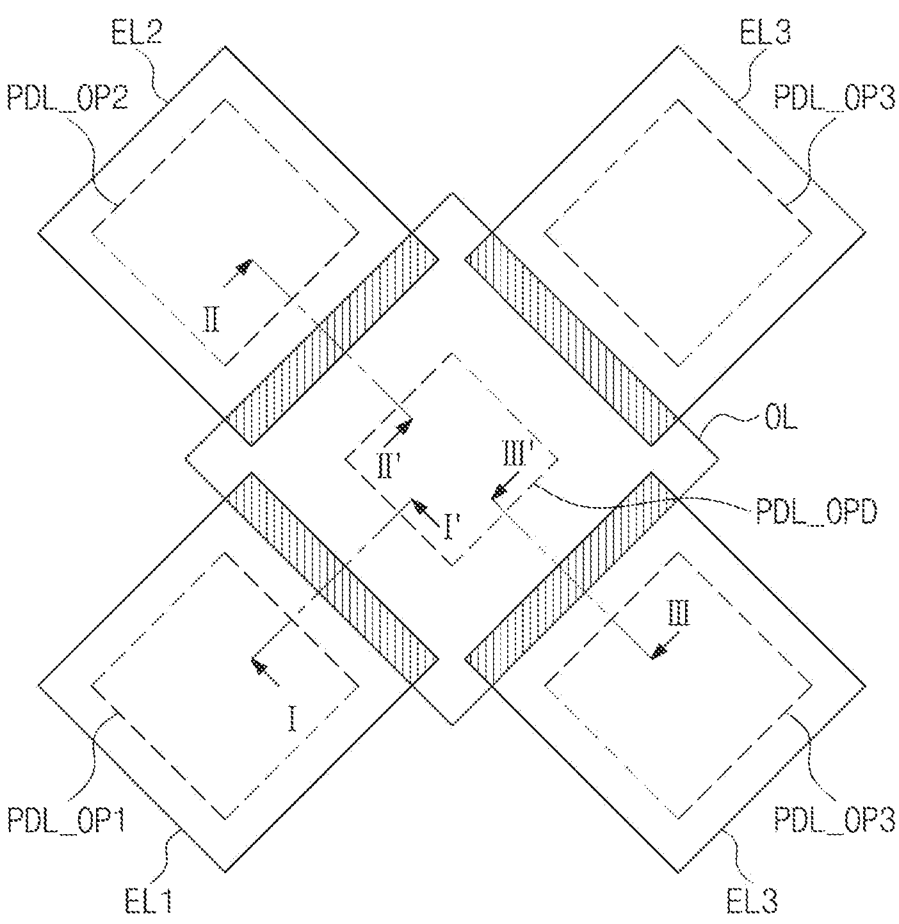
FIG. 5 is a plan view of a plurality of emission layers and a photoelectric conversion layer according to some embodiments of the inventive concept.
Figure 5:
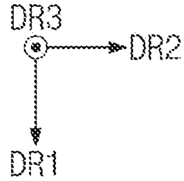

FIG. 5 is a plan view of a plurality of emission layers EL1, EL2, and EL3 and a photoelectric conversion layer OL according to some embodiments of the inventive concept.

Referring to FIG. 5, the plurality of emission layers EL1, EL2, and EL3 may include a first emission layer EL1, a second emission layer EL2, and a third emission layer EL3. The first emission layer EL1 may emit first color light. The second emission layer EL2 may emit second color light. The second color light may be different from the first color light. The third emission layer EL3 may emit third color light. The third color light may be different from the first color light and the second color light. According to some embodiments, the first emission layer EL1, the second emission layer EL2, and the third emission layer EL3 may be spaced apart.

The photoelectric conversion layer OL may be adjacent to one first emission layer EL1, one second emission layer EL2, and two third emission layers EL3. The photoelectric conversion layer OL may partially overlap at least any one of the first emission layer EL1, the second emission layer EL2, or the third emission layer EL3. As a portion of the photoelectric conversion layer OL overlaps a portion of the plurality of emission layers EL1, EL2, and EL3, more light emitting elements may be located within the same size of area. Accordingly, a high-resolution display device DD (see FIG. 1) may be provided. The structure as described above may be determined by checking whether overlapping takes place, using a microscope or analysis of boundary surface composition of pixels.

Figure 6:
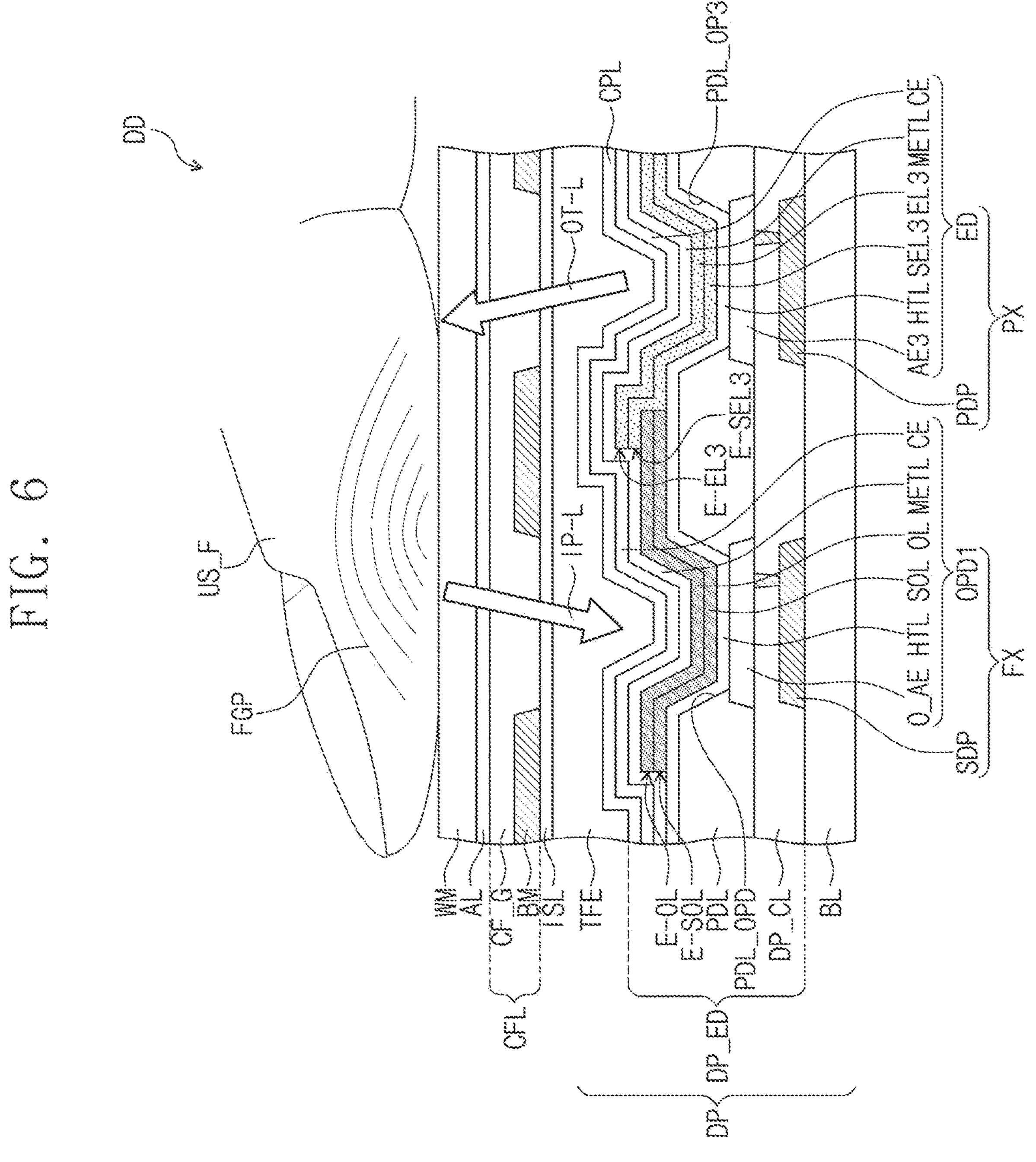
FIG. 6 is a cross-sectional view showing a portion of a display device according to some embodiments of the inventive concept.

FIG. 6 is a cross-sectional view showing a portion of a display device DD according to some embodiments of the inventive concept. FIG. 6 shows a state in which a sensor FX recognizes a fingerprint FGP, which is one of biometric information input through a user's hand US_F. FIG. 6 will be described with reference to FIG. 2, and descriptions of the same reference numerals will be omitted.

Referring to FIGS. 2 and 6, the display device DD includes a display panel DP, an input sensing layer ISL located on the display panel DP, an anti-reflection layer CFL located on the input sensing layer ISL, and a window WM located on the anti-reflection layer CFL. The display panel DP includes a base layer BL, a circuit layer DP_CL, an element layer DP_ED, and an encapsulation layer TFE.

The element layer DP_ED may be located on the circuit layer DP_CL. The element layer DP_ED may include a first photo-sensing element OPD1 of the sensor FX, a light emitting element ED of the pixel PX, a pixel defining film PDL, and a capping layer CPL.

In the present description, the first color light may correspond to blue light, the second color light may correspond to red light, and the third color light may correspond to green light. In FIG. 6, only one light emitting element ED providing green light is shown as a typical example.

The pixel PX may include the light emitting element ED and a pixel driver PDP. The light emitting element ED may include an organic light emitting element or a quantum dot light emitting element. However, the embodiments are not limited thereto, and the light emitting element ED may include various embodiments as long as according to electrical signals, light is generated or the amount of light is controlled.

The sensor FX may include the first photo-sensing element OPD1 and a sensor driver SDP. The first photo-sensing element OPD1 may be a photo-sensor that recognizes light in visible light ranges reflected by external objects. According to some embodiments, the first photo-sensing element OPD1 may be a biometric sensor that recognizes light reflected from a user's body part, such as vein as well as fingerprint, and converts light signals into electrical signals.

Emitted light OT-L emitted from the light emitting element ED may be reflected from an external object US_F (fingerprint) and be incident to the first photo-sensing element OPD1 as reflected light IP-L. The reflected light IP-L incident to the first photo-sensing element OPD1 may be light in the visible light ranges. For example, the reflected light IP-L may be green light. The first photo-sensing element OPD1 may receive the incident reflected light IP-L, convert the light into electrical signals to recognize external inputs, and accordingly change the driving state of the display device DD.

The first photo-sensing element OPD1 may include an anode O_AE, a hole control layer HTL, an auxiliary photoelectric conversion layer SOL, a photoelectric conversion layer OL, an electron control layer METL, and a cathode CE.

The anode O_AE may be located on the circuit layer DP_CL. The anode O_AE may be exposed through a photo-sensing opening PDL_OPD of the pixel defining film PDL. The anode O_AE may be formed of a metal material, a metal alloy, or a conductive compound.

However, the material and properties of the anode O_AE are not limited thereto. For example, the anode O_AE may be a pixel electrode or a sensing electrode. The anode O_AE may be a transmissive electrode, a transflective electrode, or a reflective electrode. When the anode O_AE is a transmissive electrode, the anode O_AE may include a transparent metal oxide, such as indium tin oxide (ITO), indium zinc oxide (IZO), zinc oxide (ZnO), and indium tin zinc oxide (ITZO). When the anode O_AE is the transflective electrode or the reflective electrode, the anode O_AE may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg).

A hole control layer HTL may be located on the anode O_AE and the pixel defining film PDL. The hole control layer HTL may have a single layer formed of a single material, a single layer formed of a plurality of different materials, or a multilayer structure having a plurality of layers formed of a plurality of different materials. For example, the hole control layer HTL may have a single-layer structure formed of a hole injection layer or a hole transport layer, or a single-layer structure formed of a hole injection material or a hole transport material. According to some embodiments, the hole control layer HTL may include a hole transport layer, and may further include a hole injection layer.

An auxiliary photoelectric conversion layer SOL may be located on the hole control layer HTL, and may be located below a photoelectric conversion layer OL. The auxiliary photoelectric conversion layer SOL may be a layer provided to improve light reception efficiency of the photoelectric conversion layer OL. For example, the auxiliary photoelectric conversion layer SOL may be a resonance auxiliary layer. The auxiliary photoelectric conversion layer SOL may be a layer that controls thickness to correct the resonance of light wavelength. According to some embodiments of the inventive concept, the auxiliary photoelectric conversion layer SOL may be omitted.

The photoelectric conversion layer OL may be located on the auxiliary photoelectric conversion layer SOL. The photoelectric conversion layer OL may include a light-receiving material that receives light and converts the light into electrical signals. According to some embodiments, the photoelectric conversion layer OL may include an organic light-receiving material. However, the material constituting the photoelectric conversion layer OL is not limited thereto. For example, the photoelectric conversion layer OL may include an organic polymer material as a light-receiving material, and the photoelectric conversion layer OL may include a conjugated polymer. The photoelectric conversion layer OL may include a thiophene-based conjugated polymer, a benzodithiophene-based conjugated polymer, a thieno [3,4-c]pyrrole-4,6-dione (TPD)-based conjugated polymer, a diketo-pyrrole-pyrrole (DPP)-based conjugated polymer, a benzothiadiazole (BT)-based conjugated polymer, and the like.

The auxiliary photoelectric conversion layer SOL and the photoelectric conversion layer OL may be deposited using the same fine metal mask. Accordingly, an edge E-SOL of the auxiliary photoelectric conversion layer SOL and an edge E-OL of the photoelectric conversion layer OL may be aligned. That is, when viewed on a plane, the photoelectric conversion layer OL may overlap the auxiliary photoelectric conversion layer SOL.

The electron control layer METL may be located on the photoelectric conversion layer OL, the first emission layer EL1, and the hole control layer HTL. The electron control layer METL may have a single-body shape. The electron control layer METL may have a single layer formed of a single material, a single layer formed of a plurality of different materials, or a multilayer structure having a plurality of layers formed of a plurality of different materials. For example, the electron control layer METL may have a single layer structure of an electron injection layer or an electron transport layer, and may have a single layer structure formed of an electron injection material and an electron transport material. In addition, the electron control layer METL may have a single layer structure formed of a plurality of different materials, or may further include a plurality of layers sequentially stacked from an emission layer. According to some embodiments, the electron control layer METL may include an electron transport layer and may further include an electron injection layer.

The cathode CE may be located on the electronic control layer METL, and may be formed together through the same process. The cathode CE may have a single-body shape. The cathode CE may be a common electrode. However, the cathode CE is not limited thereto. For example, the cathode CE may be a transmissive electrode, a transflective electrode, or a reflective electrode. When the cathode CE is a transmissive electrode, the cathode CE may include a transparent metal oxide, such as indium tin oxide (ITO), indium zinc oxide (IZO), zinc oxide (ZnO), and indium tin zinc oxide (ITZO). When the cathode CE is the transflective electrode or the reflective electrode, the anode O_AE may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg).

The sensor driver SDP may be located on the circuit layer DP_CL. The sensor driver SDP may include a sensor driving circuit SD (see FIG. 4) electrically connected to the first photo-sensing element OPD1 to drive the first photo-sensing element OPD1. The sensor driver SDP may be connected one-to-one to each of the plurality of photo-sensing elements OPD1 and OPD2 (see FIG. 4). However, the embodiments of the inventive concept are not limited thereto, and the sensor driver SDP may be connected to two or more of the plurality of photo-sensing elements OPD1 and OPD2.

The light emitting element ED may include a third anode AE3, a hole control layer HTL, a third auxiliary emission layer SEL2, a third emission layer SEL3, an electronic control layer METL, and a cathode CE. The descriptions of the anode O_AE of the first photo-sensing element OPD1, the hole control layer HTL, the electronic control layer METL, and the cathode CE may be equally applied to the third anode AE3, the hole control layer HTL, the electron control layer METL, and the cathode CE.

The third auxiliary emission layer SEL3 may be located on the hole control layer HTL. The third auxiliary emission layer SEL3 may be located below the third emission layer EL3. The third auxiliary emission layer SEL3 may be a layer provided to improve light output efficiency of the third emission layer EL3. For example, the third auxiliary emission layer SEL3 may be a resonance auxiliary layer. The auxiliary photoelectric conversion layer SOL may be a layer that controls thickness to correct the resonance of light wavelength. According to some embodiments of the inventive concept, the third auxiliary emission layer SEL3 may be omitted.

The third emission layer EL3 may be located on the third auxiliary emission layer SEL3. The third emission layer EL3 may be a green emission layer, but is not particularly limited thereto. The third emission layer EL3 may include an organic material and/or an inorganic material. The third emission layer EL3 may generate colored light. The third emission layer EL3 may include an organic light emitting material or a quantum dot material.

The edge E-SEL3 of the third auxiliary emission layer SEL3 and the edge E-EL3 of the third emission layer EL3 may be aligned. That is, when viewed on a plane, the third emission layer EL3 may overlap the third auxiliary emission layer SEL3.

The pixel driver PDP may be located on the circuit layer DP_CL. The pixel driver PDP may include a pixel driving circuit PD (see FIG. 4) electrically connected to the light emitting element ED to drive the light emitting element ED. The pixel driver PDP may be connected one-to-one to each of the plurality of light emitting elements ED1, ED2, and ED3 (see FIGS. 7B and 7C).

The pixel defining film PDL may be located on the circuit layer DP_CL. A first opening PDL_OP1 (see FIG. 5), a second opening PDL_OP2 (see FIG. 5), a third opening PDL_OP3, and a photo-sensing opening PDL_OPD may be defined in the pixel defining film PDL. The first emission layer EL1 (see FIG. 5) may be located in the first opening PDL_OP1, the second emission layer EL2 (see FIG. 5) may be located in the second opening PDL_OP2, and the third emission layer EL3 may be located on the third opening PDL_OP3. FIG. 6 only shows the third opening PDL_OP3 and the photo-sensing opening PDL_OPD as a typical example.

The third opening PDL_OP3 may expose at least a portion of a third anode AE3. The third auxiliary emission layer SEL3 and the third emission layer EL3 are located on the third anode AE3 exposed by the third opening PDL_OP3. The photo-sensing opening PDL_OPD may expose at least a portion of the anode O_AE. The auxiliary photoelectric conversion layer SOL and the photoelectric conversion layer OL are located on the anode O_AE exposed by the photo-sensing opening PDL_OPD.

According to some embodiments of the inventive concept, the pixel defining film PDL may further include a black material. The pixel defining film PDL may further include a black organic dye/pigment such as carbon black or aniline black. The pixel defining film PDL may be formed when a blue organic material is mixed with a black organic material. The pixel defining film PDL may further include a liquid-repellent organic material.

The capping layer CPL may be located on the cathode CE and may cover the cathode CE.

The anti-reflection layer CFL may include alight blocking pattern BM and a plurality of color filters. The plurality of color filters may include a red color filter, a green color filter CF_G, and a blue color filter, and the green color filter CF_G is shown in FIG. 6. The light blocking pattern BM may be located on the input sensing layer ISL. The green color filter CF_G may be located on the light blocking pattern BM and the input sensing layer ISL, and may cover the light blocking pattern BM. The light blocking pattern BM may prevent light leakage and set boundaries between adjacent color filters of different colors.

The light blocking pattern BM may be a black matrix. The light blocking pattern BM may include an organic pigment or dye. The light blocking pattern BM may be formed including an organic light blocking material or an inorganic light blocking material, both including a black pigment or a black dye. The light blocking pattern BM may be formed from a light blocking composition including propylene glycol monomethyl ether acetate, 3-methoxybutyl acetate, and an organic black pigment. In addition, the light blocking pattern BM may overlap the pixel defining film PDL.

Referring to FIGS. 5 and 6, the photoelectric conversion layer OL may non-overlap the first opening PDL_OP1, the second opening PDL_OP2, and the third opening PDL_OP3. According to some embodiments, at least two of the first to third emission layers EL1, EL2, and EL3 may partially overlap each other. However, each of the first opening PDL_OP1 in which the first emission layer EL1 is located, the second opening PDL_OP2 in which the second emission layer EL2 is located, and the third opening PDL_OP3 in which the third emission layer EL3 is located may non-overlap each other.

Figure 7A:
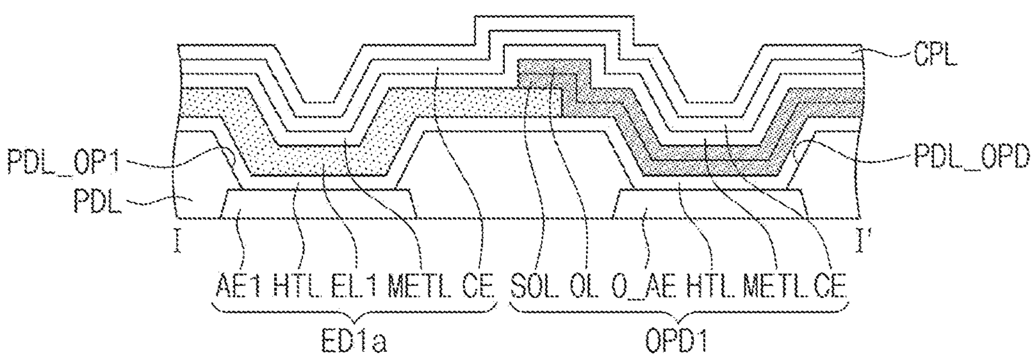
FIG. 7A is a cross-sectional view showing an element layer corresponding to the line I-I' shown in FIG. 5.
Figure 7B:
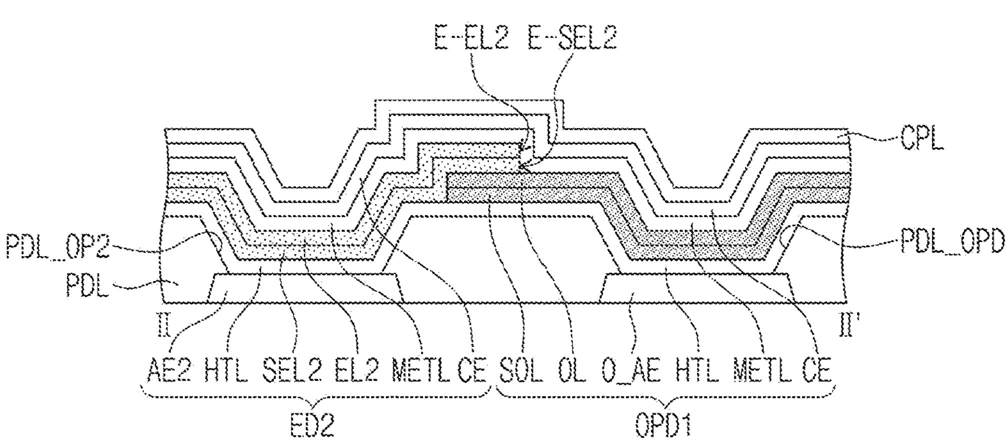
FIG. 7B is a cross-sectional view showing an element layer corresponding to the line II-II' shown in FIG. 5.
Figure 7C:
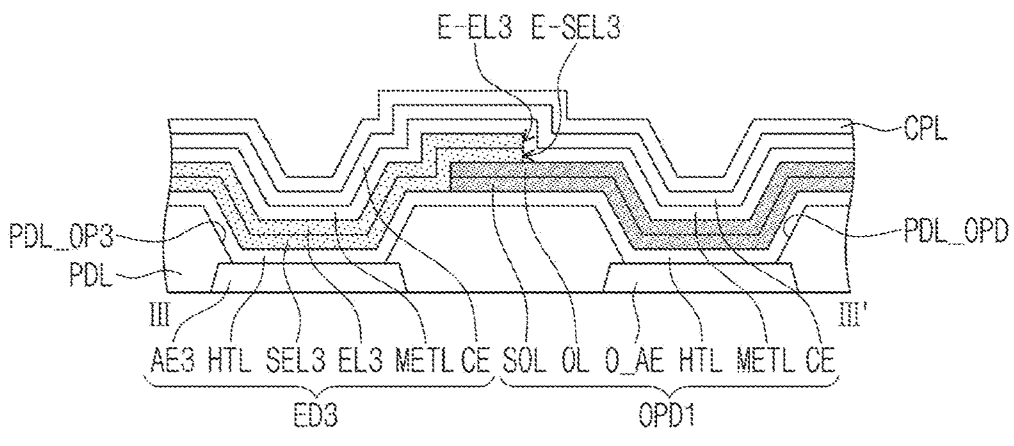
FIG. 7C is a cross-sectional view showing an element layer corresponding to the line III-III' shown in FIG. 5.

FIG. 7A is a cross-sectional view showing an element layer DP_ED (FIG. 6) corresponding to I-I' shown in FIG. 5. FIG. 7B is a cross-sectional view showing an element layer DP_ED (FIG. 6) corresponding to II-II' shown in FIG. 5. FIG. 7C is a cross-sectional view showing an element layer DP_ED (FIG. 6) corresponding to III-III' shown in FIG. 5. FIGS. 7A to 7C may be described with reference to FIGS. 5 and C, and descriptions of the same reference numerals will be omitted.

Referring to FIG. 7A, a first light emitting element ED1*a* may include a first anode AE1, a hole control layer HTL, a first emission layer EL1, an electronic control layer METL, and a cathode CE. A portion of the first emission layer EL1 may be located between the pixel defining film PDL and a portion of the photoelectric conversion layer OL. A portion of an upper surface of the first emission layer EL1 may directly contact a portion of a lower surface of the auxiliary photoelectric conversion layer SOL. The first light emitting element ED1*a* of FIG. 7A may have a structure in which the first auxiliary emission layer SEL1 (see FIG. 6) is omitted in the first light emitting element ED1 of FIG. 6.

The first photo-sensing element OPD1 may include an anode O_AE, a hole control layer HTL, an auxiliary photoelectric conversion layer SOL, a photoelectric conversion layer OL, an electron control layer METL, and a cathode CE.

Referring to FIG. 7B, a second light emitting element ED2 may include a second anode AE2, a hole control layer HTL, a second auxiliary emission layer SEL2, a second emission layer SEL2, an electronic control layer METL, and a cathode CE. The second auxiliary emission layer SEL2 may be located below the second emission layer EL2. The edge E-SEL2 of the second auxiliary emission layer SEL2 and the edge E-EL2 of the second emission layer EL2 may be aligned. That is, when viewed on a plane, the second emission layer EL2 may overlap the second auxiliary emission layer SEL2.

Referring to FIG. 7C, a third light emitting element ED3 may include a third anode AE3, a hole control layer HTL, a third auxiliary emission layer SEL2, a third emission layer SEL3, an electronic control layer METL, and a cathode CE. The third auxiliary emission layer SEL3 may be located below the second emission layer EL3. The edge E-SEL3 of the third auxiliary emission layer SEL3 and the edge E-EL3 of the third emission layer EL3 may be aligned. That is, when viewed on a plane, the third emission layer EL3 may overlap the third auxiliary emission layer SEL3.

Referring to FIGS. 5 and 7A to 7C, a portion of the photoelectric conversion layer OL may be located on a portion of at least any one of a first emission layer EL1*a*, a second emission layer EL2, or a third emission layer EL3. The portion of the photoelectric conversion layer OL may be located below a portion of at least any one of the first emission layer EL1*a*, the second emission layer EL2, or the third emission layer EL3. FIGS. 7A to 7C show that a portion of the photoelectric conversion layer OL is located on the first emission layer EL1*a*, and a portion of the photoelectric conversion layer OL is located below the second emission layer EL2 and the third emission layer EL3 as an example. However, the arrangement structure of the photoelectric conversion layer OL is not limited thereto.

The photoelectric conversion layer OL may partially overlap at least any one of the first emission layer EL1*a*, the second emission layer EL2, or the third emission layer EL3. The auxiliary photoelectric conversion layer SOL may partially overlap at least any one of the first emission layer EL1*a*, the second emission layer EL2, or the third emission layer EL3.

The plurality of light emitting elements ED1*a*, ED2, and ED3 may include at least any one of a first auxiliary emission layer SEL1 (see FIG. 6), a second auxiliary emission layer SEL2, or a third auxiliary emission layer SEL3. FIGS. 7A to 7C show that the first auxiliary emission layer SEL1 is omitted, and the second auxiliary emission layer SEL2 and the third auxiliary emission layer SEL3 are included. However, the presence/absence of the auxiliary emission layers SEL1, SEL2, and SEL3 is not limited thereto.

Referring to FIGS. 5 and 6, the circuit layer DP_CL may be formed on the base layer BL. The pixel defining film PDL may be formed on the circuit layer DP_CL. The first opening PDL_OP1, the second opening PDL_OP2, the third opening PDL_OP3, and the photo-sensing opening PDL_OPD may be defined in the pixel defining film PDL. The first emission layer EL1 may be located in the first opening PDL_OP1, the second emission layer EL2 may be located in the second opening PDL_OP2, and the third emission layer EL3 may be located on the third opening PDL_OP3. The element layer DP_ED may be formed on the circuit layer DP_CL.

The forming of the element layer DP_ED may include forming the first emission layer EL1, forming the second emission layer EL2, forming the third emission layer EL3, and forming the photoelectric conversion layer OL. The photoelectric conversion layer OL may be formed to partially overlap at least any one of the first emission layer EL1, the second emission layer EL2, or the third emission layer EL3. In addition, the photoelectric conversion layer OL may be formed to non-overlap the first opening PDL_OP1, the second opening PDL_OP2, and the third opening PDL_OP3.

The forming of the element layer DP_ED may further include forming the auxiliary photoelectric conversion layer SOL. The auxiliary photoelectric conversion layer SOL may be formed below the photoelectric conversion layer OL. In addition, the auxiliary photoelectric conversion layer SOL may be formed to partially overlap at least any one of the first emission layer EL1, the second emission layer EL2, or the third emission layer EL3, and be formed to non-overlap the first opening PDL_OP1, the second opening PDL_OP2, and the third opening PDL_OP3

The forming of the element layer DP_ED may further include forming a first auxiliary emission layer SEL1, a second auxiliary emission layer SEL2, and a third auxiliary emission layer SEL3. The first auxiliary emission layer SEL1 may be formed below the first emission layer EL1, the second auxiliary emission layer SEL2 may be formed below the second emission layer EL2, and the third auxiliary emission layer SEL3 may be formed below the third emission layer EL3.

Referring to FIGS. 7A to 7C, according to the forming of the element layer DP_ED, the first emission layer EL1, the photoelectric conversion layer OL, the second emission layer EL2, and the third emission layer EL3 may be sequentially formed. As a result, a portion of the photoelectric conversion layer OL may be located on a portion of the first emission layer EL1, and a portion of the second emission layer EL2 and the third emission layer EL3 may be located on a portion of the photoelectric conversion layer OL. According to some embodiments, the first light emitting element ED1*a* may include a first auxiliary emission layer located below the first emission layer EL1, and the second light emitting element ED2 or the third light emitting element ED3 may omit a second auxiliary emission layer SEL2 located below the second emission layer EL2 and a third auxiliary emission layer SEL3 located below the third emission layer EL3.

Figure 8A:
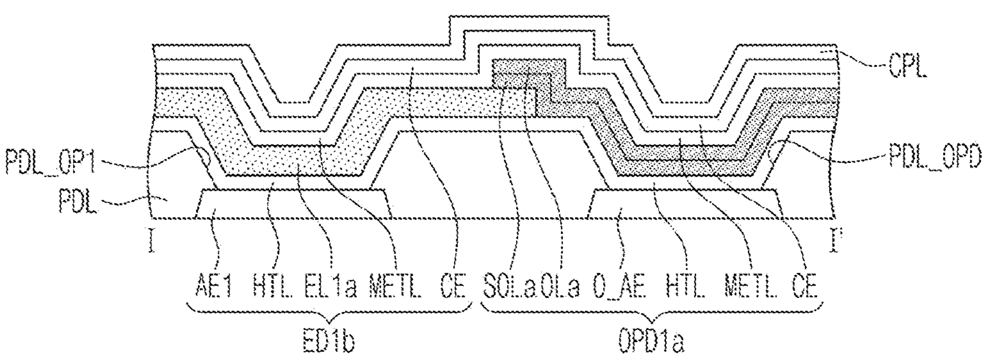
FIG. 8A is a cross-sectional view showing an element layer corresponding to the line I-I' shown in FIG. 5.
Figure 8B:
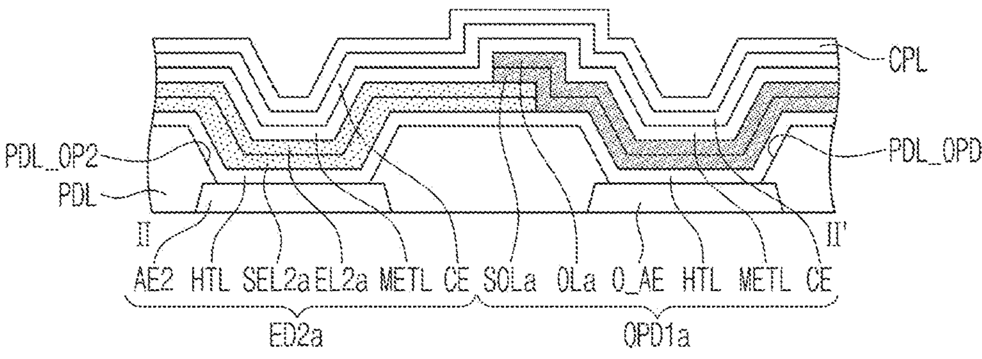
FIG. 8B is a cross-sectional view showing an element layer corresponding to the line II-II' shown in FIG. 5.
Figure 8C:
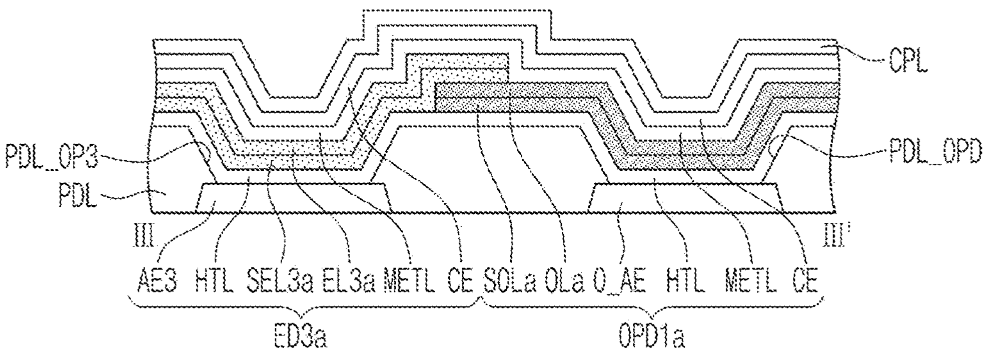
FIG. 8C is a cross-sectional view showing an element layer corresponding to the line III-III' shown in FIG. 5.

FIG. 8A is a cross-sectional view showing an element layer DP_ED (FIG. 6) corresponding to I-I' shown in FIG. 5. FIG. 8B is a cross-sectional view showing an element layer DP_ED (FIG. 6) corresponding to II-II' shown in FIG. 5. FIG. 8C is a cross-sectional view showing an element layer DP_ED (FIG. 6) corresponding to III-III' shown in FIG. 5. FIGS. 8A to 8C will be described with reference to FIGS. 7A to 7C, and descriptions of the same reference numerals will be omitted.

Referring to FIGS. 8A to 8C, according to the forming of the element layer DP_ED, the first emission layer EL1*a*, a second emission layer EL2*a*, a photoelectric conversion layer OLa, and the third emission layer EL3*a* may be sequentially formed. As a result, portions of the photoelectric conversion layer OLa may be respectively located on portions of the first emission layer EL1*a* and the second emission layer EL2*a*, and a portion of the third emission layer EL3*a* may be formed on a portion of the photoelectric conversion layer OLa. According to some embodiments, the first light emitting element ED1*b* may include a first auxiliary emission layer located below the first emission layer EL1*a*, and the second light emitting element ED2*a* or the third light emitting element ED3*a* may omit a second auxiliary emission layer SEL2*a* located below the second emission layer EL2*a* and a third auxiliary emission layer SEL3*a*.

Figure 9A:
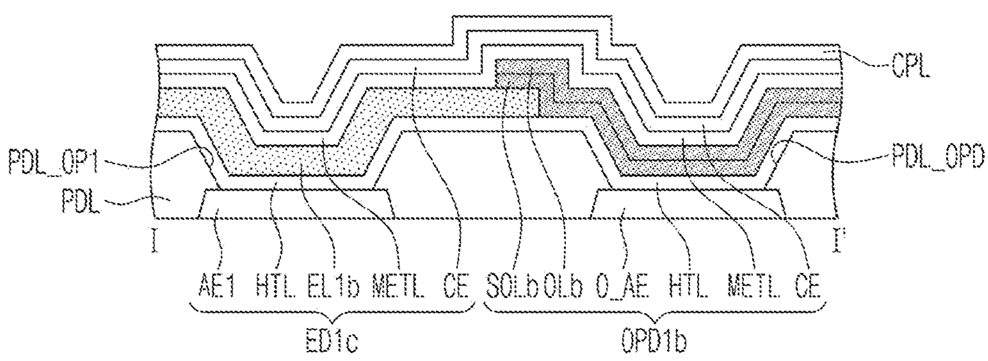
FIG. 9A is a cross-sectional view showing an element layer corresponding to the line I-I' shown in FIG. 5.
Figure 9B:
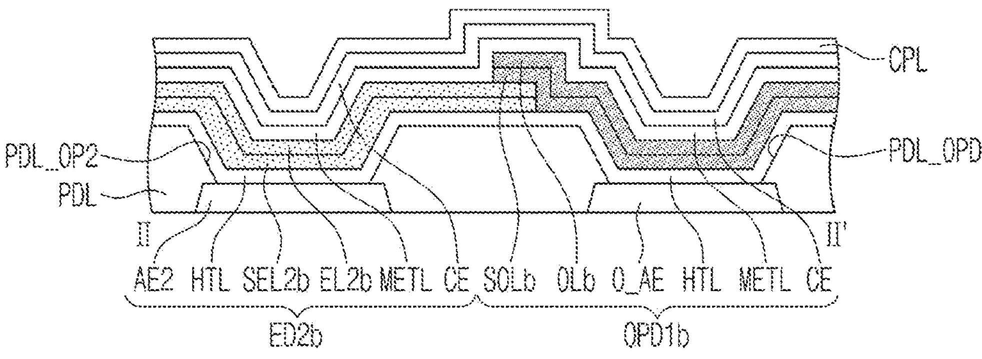
FIG. 9B is a cross-sectional view showing an element layer corresponding to the line II-II' shown in FIG. 5.
Figure 9C:
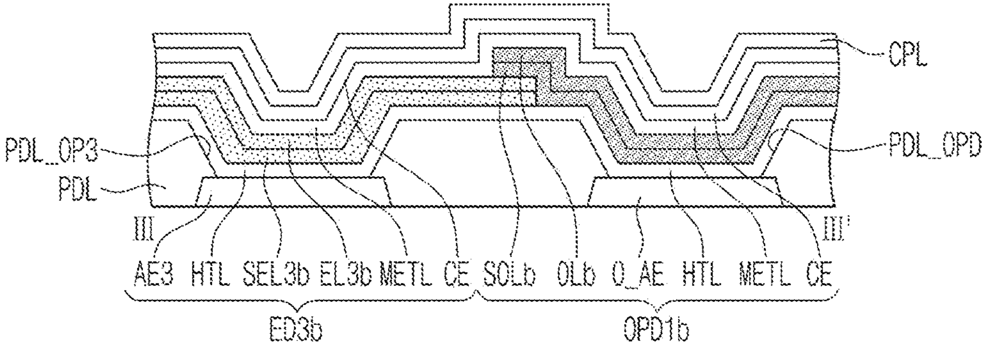
FIG. 9C is a cross-sectional view showing an element layer corresponding to the line III-III' shown in FIG. 5.

FIG. 9A is a cross-sectional view showing an element layer DP_ED (FIG. 6) corresponding to I-I' shown in FIG. 5. FIG. 9B is a cross-sectional view showing an element layer DP_ED (FIG. 6) corresponding to II-II' shown in FIG. 5. FIG. 9C is a cross-sectional view showing an element layer DP_ED (FIG. 6) corresponding to III-III' shown in FIG. 5. FIGS. 9A to 9C may be described with reference to FIGS. 7A to 7C, and descriptions of the same reference numerals will be omitted.

Referring to FIGS. 9A to 9C, according to the forming of the element layer DP_ED, a first emission layer EL1*b*, a second emission layer EL2*b*, a third emission layer EL3*b*, and a photoelectric conversion layer OLb may be sequentially formed. As a result, portions of the photoelectric conversion layer OLb may respectively be located on portions of the first emission layer EL1*b*, the second emission layer EL2*b*, and the third emission layer EL3*b*. According to some embodiments, the first light emitting element ED1*c* may include a first auxiliary emission layer located below the first emission layer EL1*b*, and the second light emitting element ED2*b* or the third light emitting element ED3*b* may omit a second auxiliary emission layer SEL2*b* located below the second emission layer EL2*b* and a third auxiliary emission layer SEL3*b* located below the third emission layer EL3*b*.

Figure 10:
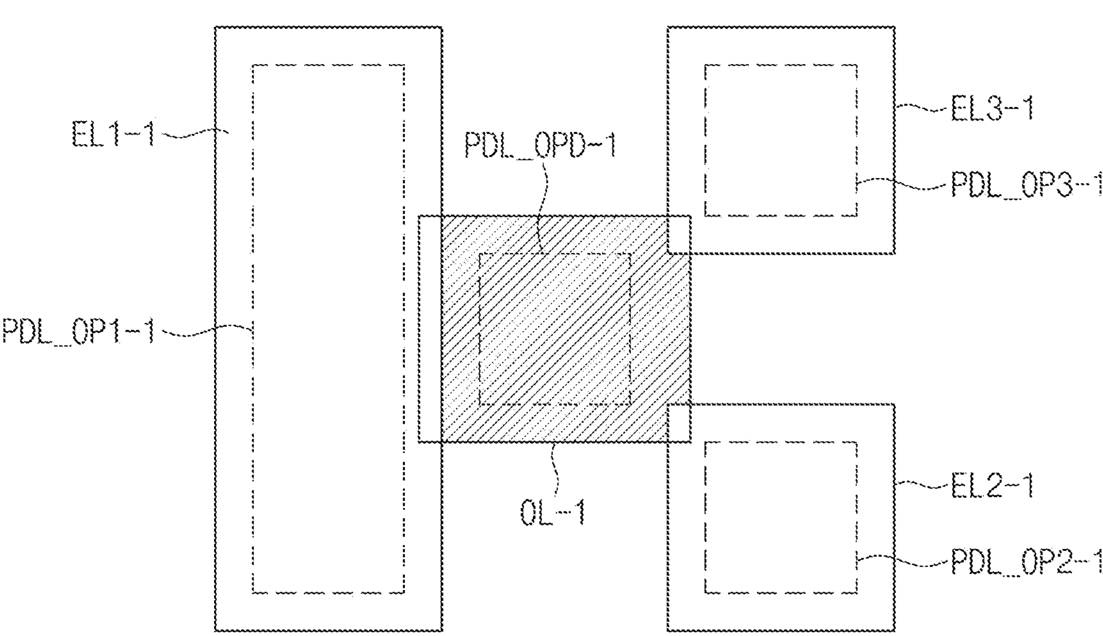
FIG. 10 is a plan view of a plurality of emission layers and a photoelectric conversion layer according to some embodiments of the inventive concept.
Figure 10:
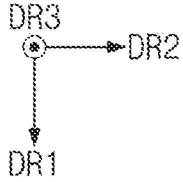

FIG. 10 is a plan view of a plurality of emission layers EL1-1, EL2-1, and EL3-1 and a photoelectric conversion layer OL-1 according to some embodiments of the inventive concept.

Referring to FIG. 10, the plurality of emission layers EL1-1, EL2-1, and EL3-1 may include a first emission layer EL1-1, a second emission layer EL2-1, and a third emission layer EL3-1. The first emission layer EL1-1 may emit first color light. The second emission layer EL2-1 may emit second color light. The second color light may be different from the first color light. The third emission layer EL3-1 may emit third color light. The third color light may be different from the first color light and the second color light. The photoelectric conversion layer OL-1 may partially overlap at least any one of the first emission layer EL1-1, the second emission layer EL2-1, or the third emission layer EL3-1.

An area of the first emission layer EL1-1 may be larger than an area of each of the second emission layer EL2-1 and the third emission layer EL3-1. For example, the first emission layer EL1-1 may be a layer that emits blue light, the second emission layer EL2-1 may be a layer that emits red light, and the third emission layer EL3-1 may be a layer that emits green light.

The photoelectric conversion layer OL-1 may non-overlap a first opening PDL_OP1-1, a second opening PDL_OP2-1, and a third opening PDL_OP3-1. According to some embodiments, at least two of the first to third emission layers EL1-1, EL2-1, and EL3-1 may partially overlap each other. However, each of the first opening PDL_OP1-1 in which the first emission layer EL1-1 is located, the second opening PDL_OP2-1 in which the second emission layer EL2-1 is located, and the third opening PDL_OP3-1 in which the third emission layer EL3-1 is located may non-overlap each other.

As described above, a portion (e.g., only a portion, and not an entirety) of a photoelectric conversion layer overlaps a portion of a plurality of emission layers, and more light emitting elements may thus be located in the same size of area. Accordingly, a high-resolution display device may be provided.

Although aspects of the present disclosure have been described with reference to some embodiments of the inventive concept, it will be understood that the inventive concept should not be limited to these example embodiments but various changes and modifications can be made by those skilled in the art without departing from the spirit and scope of the present disclosure. Hence, the technical scope of embodiments according to the present disclosure is not limited to the detailed descriptions in the specification but should be determined only with reference to the claims, and their equivalents.

What is claimed is:

1. A display device comprising:

a base layer;

a circuit layer on the base layer; and an element layer on the circuit layer and including a plurality of light emitting elements and a photo-sensing element, wherein the plurality of light emitting elements include:

a first emission layer configured to emit a first color light;

a second emission layer configured to emit a second color light different from the first color light; and a third emission layer configured to emit a third color light different from the first color light and the second color light, the photo-sensing element includes a photoelectric conversion layer overlapping at least any one of a part of the first emission layer, a part of the second emission layer, or a part of the third emission layer; and a pixel defining film on the circuit layer and having a first opening in which the first emission layer is located, a second opening in which the second emission layer is located, and a third opening in which the third emission layer is defined therein, wherein the photoelectric conversion layer does not overlap the first opening, the second opening, and the third opening.

2. The display device of claim 1, wherein the first emission layer, the second emission layer, and the third emission layer are spaced apart.

3. The display device of claim 1, wherein the photoelectric conversion layer overlaps portions of each of the first to third emission layers.

4. The display device of claim 1, wherein a portion of the photoelectric conversion layer is above a portion of at least any one of the first emission layer, the second emission layer, or the third emission layer.

5. The display device of claim 1, wherein a portion of the photoelectric conversion layer is below a portion of at least any one of the first emission layer, the second emission layer, or the third emission layer.

6. The display device of claim 1, wherein the photo-sensing element further comprises an auxiliary photoelectric conversion layer below the photoelectric conversion layer, wherein the photoelectric conversion layer and the auxiliary photoelectric conversion layer are in direct contact.

7. The display device of claim 6, wherein a part of the auxiliary photoelectric conversion layer overlaps at least any one of the first emission layer, the second emission layer, or the third emission layer.

8. The display device of claim 6, wherein an edge of the photoelectric conversion layer and an edge of the auxiliary photoelectric conversion layer are aligned.

9. The display device of claim 1, wherein the plurality of light emitting elements further comprise at least any one of a first auxiliary emission layer below the first emission layer, a second auxiliary emission layer below the second emission layer, or a third auxiliary emission layer below the third emission layer.

10. The display device of claim 9, wherein an edge of the first emission layer and an edge of the first auxiliary emission layer are aligned, an edge of the second emission layer and an edge of the second auxiliary emission layer are aligned, and an edge of the third emission layer and an edge of the third auxiliary emission layer are aligned.

* * * * *